(12) United States Patent
Ingle et al.

(10) Patent No.: US 8,878,225 B2
(45) Date of Patent: Nov. 4, 2014

(54) ORGANIC LIGHT-EMITTING DEVICE HAVING HOMOGENOUS BRIGHTNESS DISTRIBUTION

(75) Inventors: Andrew Ingle, Allershausen (DE);
Benjamin Krummacher, Regensburg (DE); Erwin Lang, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/637,013

(22) PCT Filed: Mar. 9, 2011

(86) PCT No.: PCT/EP2011/053522
§ 371 (c)(1),
(2), (4) Date: Sep. 24, 2012

(87) PCT Pub. No.: WO2011/117073
PCT Pub. Date: Sep. 29, 2011

(65) Prior Publication Data
US 2013/0009199 A1    Jan. 10, 2013

(30) Foreign Application Priority Data

Mar. 22, 2010   (DE) .................... 10 2010 003 121

(51) Int. Cl.
*H01L 51/50*   (2006.01)
*H01L 51/52*   (2006.01)

(52) U.S. Cl.
CPC ..... *H01L 51/5203* (2013.01); *H01L 2251/5361* (2013.01)

USPC ............. 257/99; 257/98; 257/100; 257/40; 428/213; 313/506; 313/502; 313/500

(58) Field of Classification Search
USPC ............... 257/40, 98–100; 313/504
See application file for complete search history.

(56) References Cited

U.S. PATENT DOCUMENTS

| | | | |
|---|---|---|---|
| 2005/0270454 A1 | 12/2005 | Byung et al. | |
| 2008/0118724 A1* | 5/2008 | Cina et al. | 428/213 |
| 2009/0211640 A1* | 8/2009 | Lee et al. | 136/263 |

FOREIGN PATENT DOCUMENTS

| | | |
|---|---|---|
| DE | 102006055884 | 4/2008 |
| JP | 2001-085158 | 3/2001 |
| JP | 2008-010244 | 1/2008 |
| WO | WO2008/062645 | 5/2008 |
| WO | WO2009/025286 | 2/2009 |
| WO | WO 2009025286 A1 * | 2/2009 ............. H01L 51/00 |

* cited by examiner

*Primary Examiner* — Matthew W Such
*Assistant Examiner* — Frederick B Hargrove
(74) *Attorney, Agent, or Firm* — Cozen O'Connor

(57) ABSTRACT

An organic light-emitting device comprising an active layer for producing radiation having a first side surface and a second side surface adjoining a corner edge. A first contact strip extends along the first side surface for injecting charge carriers of a first type into the active layer. A second contact strip extends along the second side surface for injecting charge carriers of a second type into the active layer. The first side surface has a recessed region adjoining the corner edge, and the injection of charge carriers from the first contact strip is suppressed in the recessed region.

11 Claims, 6 Drawing Sheets

ORGANIC LIGHT-EMITTING DEVICE HAVING HOMOGENOUS BRIGHTNESS DISTRIBUTION

RELATED APPLICATIONS

This is a U.S. national stage of application No. PCT/EP2011/053522, filed on Mar. 9, 2011. Priority is claimed on the following application: German Application No.: 10 2010 003 121.6 Filed on Mar. 22, 2010, the disclosure content of which is hereby incorporated herein by reference.

FIELD OF THE INVENTION

The present invention relates to an organic opto-electronic device.

BACKGROUND OF THE INVENTION

An organic light-emitting device (OLED) is a luminescent radiator by means of which electromagnetic energy is produced from electrical energy. Said device has an organic active layer in which the electromagnetic radiation is produced. The active layer is arranged between an anode and a cathode. When a conducting state potential is applied, the anode injects holes into the active layer as charge carriers, whilst the cathode injects electrons as charge carriers. The injected holes and electrons each drift (under the influence of an externally applied electric field) to the oppositely charged electrode and, on recombination, create an electroluminescent emission in the active layer.

An OLED has the advantage, in particular, of being able to be used as a large-area light source. For this purpose, the OLED should have the most even possible brightness (luminance) distribution over the active layer.

SUMMARY OF THE INVENTION

One object of the present invention is to provide an organic light-emitting device in which the most homogeneous possible luminance distribution is achieved.

Various embodiments of the organic light-emitting device have an active layer for producing radiation, comprising a first side surface and a second side surface adjoining a corner edge. A first contact strip extends along the first side surface for injecting charge carriers of a first type into the active layer. A second contact strip extends along the second side surface for injecting charge carriers of a second type into the active layer. The first side surface has a recessed region adjoining the corner edge. The injection of charge carriers from the first contact strip is suppressed in the recessed region.

For this reason, in regions of the organic light-emitting device in which the contact strips for supplying the charge carriers approach one another very closely, the injection of charge carriers into the active layer is limited. The resulting limited charge carrier flow in the active layer leads, in particular, to limitation of recombination in regions which otherwise would have a strongly increased charge carrier density. As a result, the luminance in said regions is approximately of the same order of magnitude as in other regions of the active layer. In this way, a particularly homogeneous luminance distribution is achieved. The organic light-emitting device can preferably be used as a large area homogeneously illuminating light source. Said light source is therefore particularly suitable for applications which require a flat light source.

In some embodiments, the first contact strip is electrically contacted by the first side surface only outside the recessed region. In this way, suppression of the charge carrier injection along the recessed region is achieved.

In some embodiments, the injection of charge carriers from the first contact strip is completely suppressed in the recessed region. The charge carrier injection then takes place via other connection regions, for example, via main sides of the active layer or even via a charge carrier flow through the active layer. In this way, a particularly severe restriction of the charge carrier flow is achieved.

In some embodiments, a gap is formed along the recessed region between the first contact strip and the active layer. In this way, particularly good electrical insulation is obtained between the first contact strip and the recessed region of the side surface. As a consequence, for example, complete suppression of the charge carrier injection can be achieved.

In some embodiments, the second side surface has a second recessed region adjoining the corner edge and the injection of charge carriers from the second contact strip is completely suppressed in the second recessed region. Thus, suppression of the charge carrier injection at the corner edge is carried out at both the electrodes, i.e. both for the cathode and for the anode. This measure enables additional control over the charge carrier flow and also restricts unwanted charge carrier transport through the active layer.

In some embodiments, the active layer comprises a first main surface and a second main surface. A first contact connection surrounding the first contact strip extends over the first main surface. A second contact connection surrounding the second contact strip extends over the second main surface. Charge carrier injection therefore takes place not only over the contact strips, but also over the main sides of the active surface.

In some embodiments, the first contact connection has a conductivity profile, said conductivity profile decreasing from a center of the first side surface toward the recessed region. By this means, the charge carrier injection can be further influenced by the configuration of the field lines originating from the contact connection. In particular, large field gradients at the transition to the recessed region can be prevented, so that a particularly homogeneous illumination pattern can be achieved in the organic light-emitting device.

In some embodiments, the first contact connection comprises a conductive oxide, for example, a tin oxide. The first contact connection is, in particular, a transparent electrode.

In some embodiments, the first contact connection comprises a metal or a metal alloy. Metal is a particularly good electrical conductor. Preferably, the metal is provided in regions outside the radiating direction of the organic light-emitting device.

The metal can therefore be provided, in particular, in the first contact strip laterally in relation to the first side surface.

In some embodiments, the first contact connection has a first surface conductivity and the second contact connection has a second surface conductivity. The first surface conductivity and the second surface conductivity differ by not more than a factor of 10. Provided the surface conductivities of both contact connections lie within the same order of magnitude, particularly homogeneous luminance distributions are achieved with the technical solutions described. This applies all the more if, in addition to the recessed region, a second recessed region is provided. Otherwise, in the vicinity of the edge corner, the charge carrier injection can be influenced by the size of the recessed regions. In this way, even if the orders of magnitude of the surface conductivities differ, good homogeneity of luminance can be achieved.

In some embodiments, the organic light-emitting device is configured as a transparent OLED.

In some embodiments, the organic light-emitting device is configured as a bottom-emitter OLED.

BRIEF DESCRIPTION OF THE DRAWINGS

Various exemplary embodiments of the organic light-emitting devices will now be described in greater detail, making reference to the drawings. In the drawings, the first digit(s) of a reference sign indicate the figure in which the reference sign is first used. The same reference signs are used in all the figures for similar or identically acting elements or properties.

In the drawings.

DETAILED DESCRIPTION OF THE DRAWINGS

Figure 1:
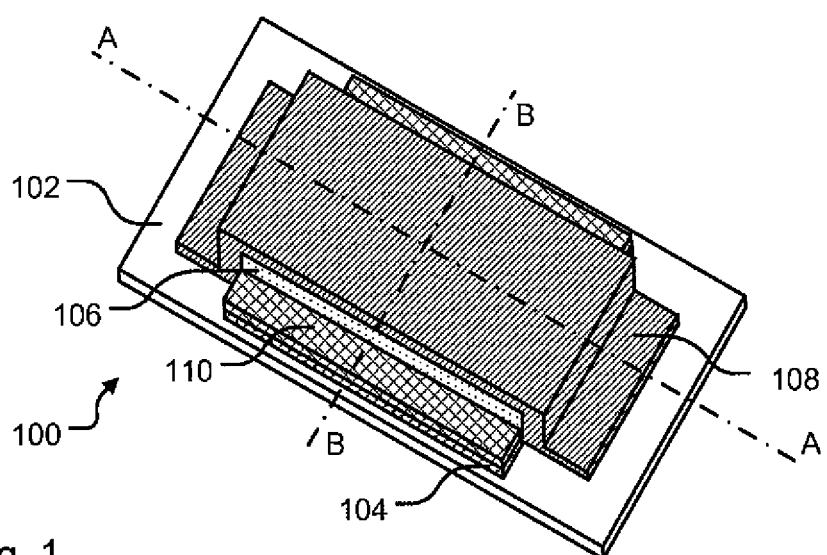
FIG. 1 is a schematic representation of a view from above of an organic light-emitting device.

FIG. 1 shows a schematic representation of a view from above of an organic light-emitting device 100. The organic light-emitting device 100 comprises a substrate 102. The substrate 102 is a transparent material, for example, a glass, quartz or a polymer film. Applied flat on the substrate 102 is a transparent contact layer 104 which is part of the first contact connection. The transparent contact layer 104 has a transparent, conductive material. Said material may be, for example, a transparent conductive oxide (TCO). The TCO is usually a metal oxide, for example, zinc oxide, tin oxide, cadmium oxide, titanium oxide, indium oxide or indium tin oxide (ITO). Apart from binary metal compounds, which include $SnO_2$ and $In_2O_3$, the group of TCOs also includes ternary metal oxide compounds, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides. The TCOs also do not necessarily consist of a stoichiometric composition and can also be p-doped or n-doped in order to achieve high conductivity.

Applied to the transparent contact layer 104 is an active layer 106 in which the electromagnetic radiation can be produced. For this purpose, the active layer 106 comprises a functional layer having an electroluminescent material. For example, the electroluminescent organic material can comprise suitable polymers for fluorescent or phosphorescent emission. Alternatively, small organic molecules which emit by means of fluorescence or phosphorescence, can serve as an electroluminescent layer. Apart from the functional layer, the active layer 106 can also have further layers, for example, a charge carrier transport layer.

Figure 2:
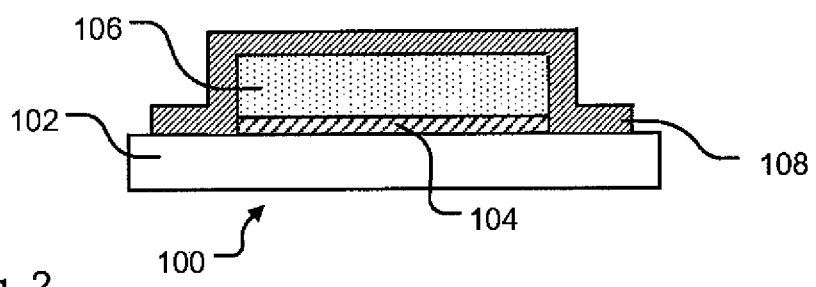
FIG. 2 is a schematic representation of a longitudinal section through the organic light-emitting device shown in FIG. 1, along the section line A-A.

FIG. 2 shows a schematic representation of a longitudinal section through the organic light-emitting device shown in FIG. 1 along the section line A-A. FIG. 2 shows that the active layer 106 is applied over the transparent contact layer 104. In general, the contact layer 104 has a first main side with which said contact layer lies on the contact layer 104 and a second main side which is covered by a second contact connection 108. In addition, the active layer 106 has, in the exemplary embodiment shown, four side surfaces of which the two mutually opposed shorter side surfaces are covered by the second contact connection 108. The second contact connection 108 extends along both the short side surfaces on the substrate 102 so that each forms a contact strip along the two short side surfaces.

Figure 3:
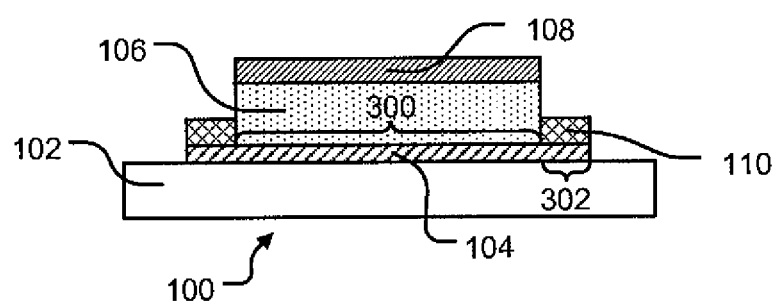
FIG. 3 is a schematic representation of a cross-section through the organic light-emitting device shown in FIG. 1, along the section line B-B.

The two mutually opposed longer side surfaces each abut a region of the transparent contact layer 104 left free by the active layer 106. This is made clear in FIG. 3. FIG. 3 shows a schematic representation of a cross-section along the section line B-B through the organic light-emitting device shown in FIG. 1. What is shown is the substrate 102 onto which the transparent contact layer 104 is applied. The transparent contact layer 104 is covered in a large area covering region 300 by the first main side of the active layer 106. Adjacent thereto, said contact layer has regions left free, for example, on the right-hand side, a region 302 left free. The active layer 106 is covered by the second contact connection 108.

A metallic contact layer 110 is applied to the region 302 left free, so that the transparent contact layer 104 and the metallic contact layer 110 provide a first contact strip of the first contact connection. The metallic contact layer 110 does not necessarily have to be arranged on the transparent contact layer 104. The use of said metallic contact layer is fundamentally optional. It is also conceivable, for example, for the metallic contact layer 110 to be arranged beneath the transparent contact layer 104 or to be surrounded by said contact layer. This arrangement offers the advantage of a particularly high charge carrier conductivity. The arrangement of the metallic contact layer 110 above the transparent contact layer 104 as described below has the advantage, inter alfa, that this layer sequence can be easily manufactured.

The first contact connection serves for the injection of a first type of charge carrier into the active layer 106. Said charge carriers, can be, for example, holes. In this case, the first contact connection is an anode. Said contact connection typically comprises an ITO with a surface conductivity of approximately 15Ω/sq. The second contact connection 108 serves for the injection of a second type of charge carrier. Said charge carriers have a different polarity from the charge carriers of the first type and are, for example, electrons. In this case, the second contact connection 108 is a cathode. A transparent cathode typically has a surface resistivity of approximately 5Ω/sq.

Figure 4:
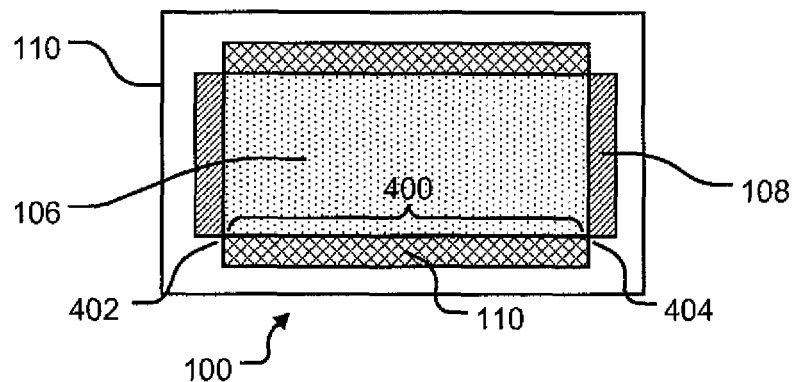
FIG. 4 is a schematic representation of a vertical surface section through the organic light-emitting device shown in FIG. 1 at the height of the metal contact layer.

The spatial arrangement of the contact strips of the first contact connection and of the second contact connection 108 will now be described in greater detail by reference to FIG. 4. FIG. 4 shows a schematic view from above of a vertical section through the organic light-emitting device of FIG. 1, at the height of the metallic contact layer 110. Shown above the substrate 102 are the active layer 106 and the contact strips of the second contact connector 110. The active layer 106 has two shorter side surfaces which abut the contact strips of the second contact connection 108. In addition, the active layer 106 comprises two mutually opposed longer side surfaces which abut the metallic contact layer 110. The metallic contact layer 110 extends along a first longer side surface 400 and contacts said side surface fully from a first corner edge 302 to a second corner edge 404. The second contact connection 110 also directly abuts the first corner edge 402 and the second corner edge 404.

The contact strips of the first contact connection and of the second contact connection 108 are situated in the region of the corner edges, for example, of the first corner edge 402 and of the second corner edge 404, close to one another. On application of a potential, the field lines of an electric field applied between the contact strips become concentrated in this region. The following relation exists between the field E and an applied potential V: E=−grad V.

The active layer 106 displays non-ohmic behavior. This means that no linear relationship exists between a potential (V) applied to the active layer 106 and a surface current (j(x,y)) flowing through the functional layer. If the active layer 106 has, for example, a p-n junction, then the behavior thereof corresponds to that of a diode such that log (j(x,y)) α V.

In an organic luminescence diode, the active layer 106 has, for example, an organic electroluminescent material which, when a potential is applied, emits light. The organic electroluminescent material is, for example, a polymer. Small organic molecules which radiate by means of fluorescence or phosphorescence can also serve as an organic electroluminescent material. In this case, charge carrier transport takes place by means of the hopping process or the tunneling process. The relationship between the potential (V) applied and the current (j(x,y)) flowing through the active layer 106 can be expressed in terms of the current-potential characteristics of an electron tube, i.e. $j(x,y) \alpha a V^{2/3}$.

Due to the high field density, in regions of the active layer 106 close to the first corner edge 402 and the second corner edge 404, large surface currents arise which are proportional to surface currents in other areas of the active layer 106. A luminance L of the active layer 106 produced by the surface current j(x,y) is directly proportional to the surface current: L α j(x,y). A higher luminance is therefore produced in the region of the first corner edge 402 and of the second corner edge 404 than in other regions of the active layer 106. The illumination pattern thereby produced is illustrated in FIG. 5.

Figure 5:
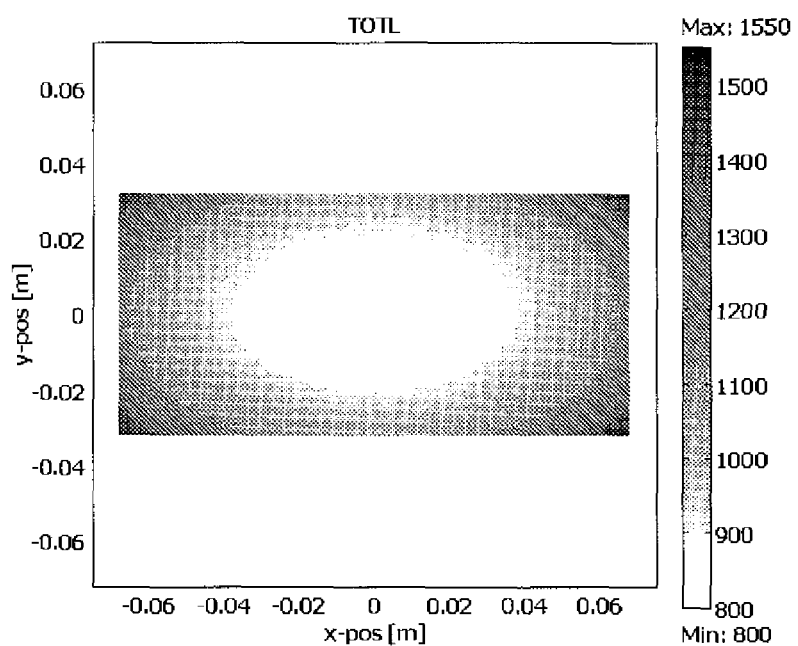
FIG. 5 is a schematic representation of a luminance distribution of the organic light-emitting device shown in FIG. 1.

FIG. 5 shows a schematic representation of a luminance distribution of the organic light-emitting device as shown in FIGS. 1 to 4. The schematic representation is based on a simulation of the luminance distribution.

The luminance distribution in cd/m² at a radiation output surface of the organic light-emitting device is shown in the form of gray scales. The abscissa (x-axis) represents the distance between the contact strips of the second contact connection 108 on the left-hand side and the right-hand side. The ordinate (y-axis) represents the distance along the contact strips of the first contact connection (see the illustration in FIG. 3). The simulation reveals that the luminance in the center between the connections is lower than in the vicinity of either the first corner edge 402 or the second corner edge 404. The luminance varies between approximately 800 cd/m² in the central region of the active layer 106 and approximately 1500 cd/m² in the region of the corner edges. The scales of distance and luminance are selected for the simulation and should therefore be understood as merely exemplary. However, the large variation of luminance is clearly evident.

Figure 6:
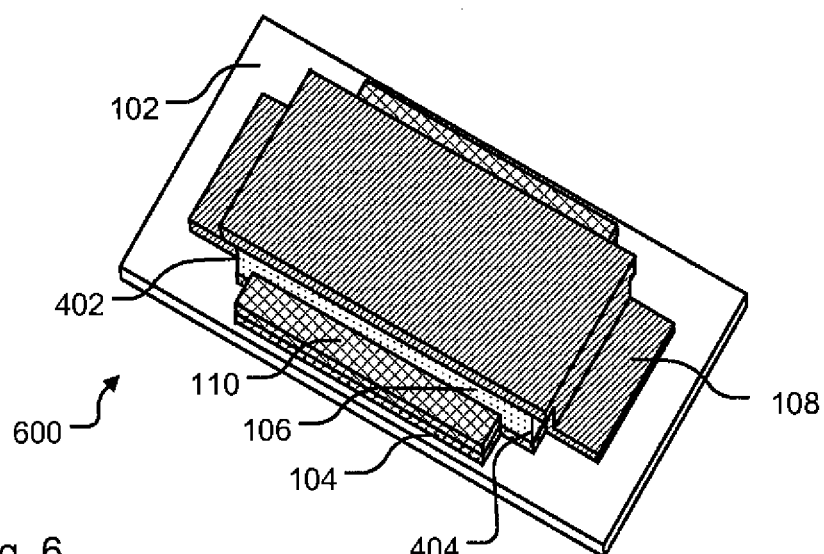
FIG. 6 is a schematic representation of a view from above of an organic light-emitting device according to a first exemplary embodiment.

FIG. 6 shows a schematic representation of a view from above of an organic light-emitting device 600 according to a first exemplary embodiment. The organic light-emitting device 600 differs from the organic light-emitting device 100 described by reference to FIGS. 1 to 4 in that the contact strips of the first contact connection and of the second contact connection 108 are cut away from the side edges of the active layer 106 in the region of the first corner edge 402 and of the second corner edge 404. This is made particularly clear in FIG. 7.

Figure 7:
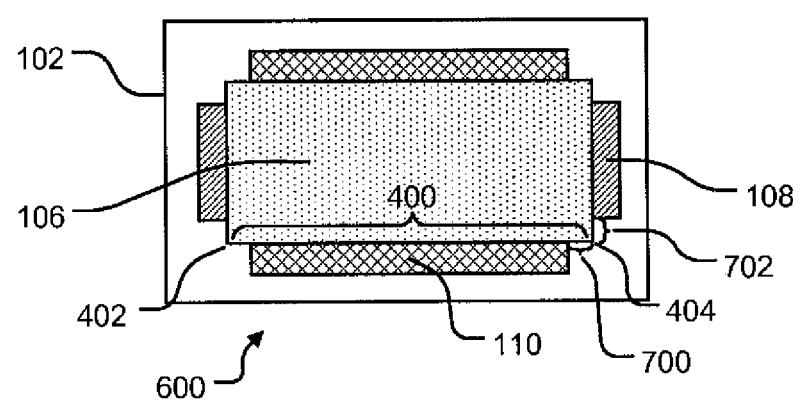
FIG. 7 is a schematic representation of a vertical section through the organic light-emitting device according to the first embodiment.

FIG. 7 shows a schematic representation of a vertical surface section through the organic light-emitting device 600 according to the first exemplary embodiment, at the height of the metallic contact layer 110. Shown above the substrate 102 are the active layer 106 and regions of the second contact connection 108 at the shorter sides of the active layer 106. The metal contact layer 110 extends along the longer sides. Said contact layer covers the side surface 400 which extends between a first corner edge 302 and a second corner edge 404. Arranged in the region of the second corner edge 404 is a recessed region 700 which is free of the metallic contact layer 110. In the recessed region 700, the side surface 400 is not electrically connected to the first contact connection. An injection of charge carriers from the first contact connection via the recessed region 700 into the active layer 106 is thus completely suppressed. In the adjoining region of the active surface 106, an injection of the charge carriers takes place largely via the transparent contact layer 104 lying under the active layer 106, as shown in FIG. 5.

The size of the recessed region 700 can be selected as required. Said region can cover more than 2.5% of the side surface 400. Typically, said region covers approximately 106 of the side surface 400, so that the side surface 400 makes contact with the metallic contact layer 110 over approximately 80% of the extent of the side surface.

Figure 8:
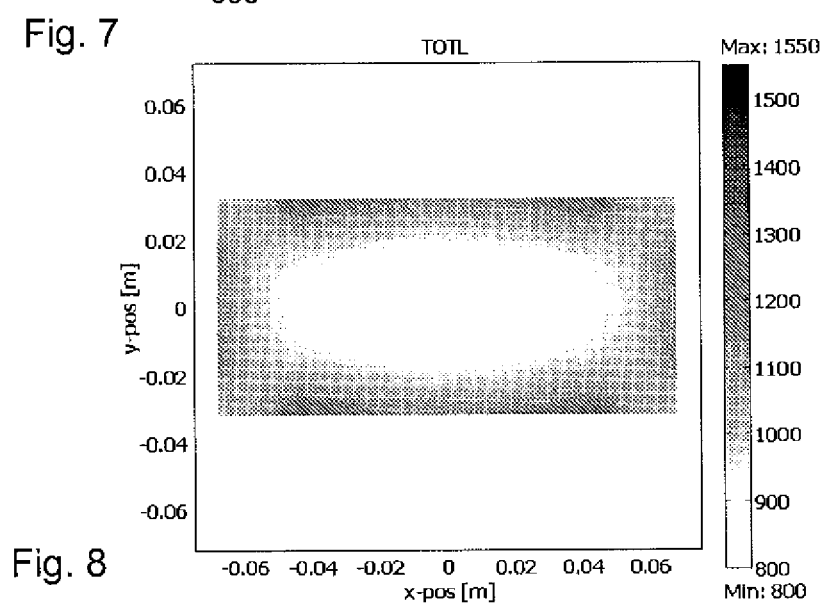
FIG. 8 is a schematic representation of a luminance distribution of the organic light-emitting device according to the first exemplary embodiment.

By means of the suppression of the charge carrier injection in the recessed region 700, the charge carrier flow passing through the region of the active surface 106 adjoining the second corner edge 404 is restricted. The increased luminance in this region is therefore reduced so that, compared to the organic light-emitting device 100 shown in FIGS. 1 to 4, a more homogeneous illumination pattern is obtained. In order to enhance this effect, the second contact connection 108 is also recessed at the second corner edge 404, so that a second recessed region 702 is provided in which no charge carriers are injected from the second contact connection 108 via the side surface into the active layer 106. Similarly acting regions are provided at all the corner edges of the side surfaces of the active layer 106. By this means, the injected charge carrier flow injected, and thus the luminance, is locally restricted at all the corner edges. Overall, therefore, a homogeneous illumination pattern is thereby obtained. This is illustrated clearly in FIG. 8, which shows a schematic representation of a luminance distribution of the first exemplary embodiment of the organic light-emitting device. FIG. 8 shows an illumination pattern comparable to that of FIG. 5, wherein only the contact strips are adjusted according to the first exemplary embodiment. For improved comparability, in all the luminance distributions described below, the parameters have been selected such that a luminance averaged over the whole luminous area of 1000 cd/m² is achieved in each case. In the luminance distribution shown in FIG. 8, the luminance in the region of the corner edges is essentially in the same order of magnitude as the luminance obtained in other regions of the organic light-emitting device, that is, in the range of approximately 900 cd /m² to 1000 cd/m². Overall, a significantly more homogeneous illumination pattern is obtained than in FIG. 5.

Figure 9:
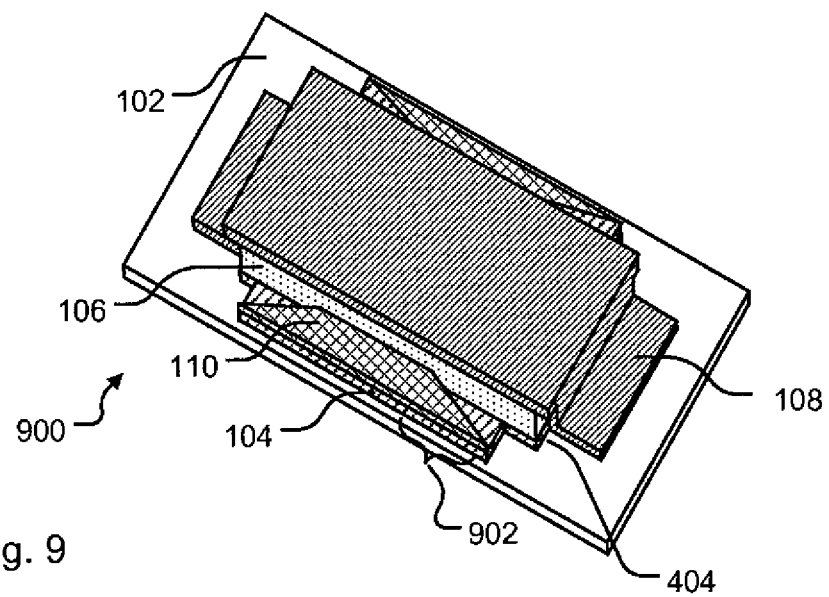
FIG. 9 is a schematic representation of a view from above of an organic light-emitting device according to a second exemplary embodiment.
Figure 10:
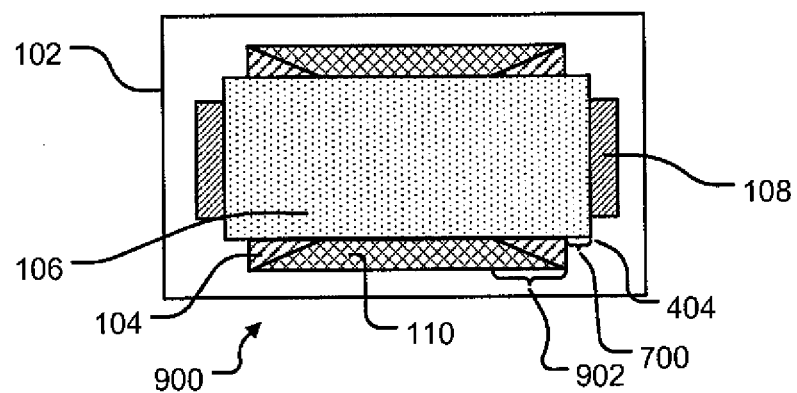
FIG. 10 is a schematic representation of a vertical section through the organic light-emitting device according to the second exemplary embodiment.

FIG. 9 shows a schematic representation of a view from above of an organic light-emitting device according to a second exemplary embodiment. An organic light-emitting device 900 according to the second exemplary embodiment differs from an organic light-emitting device 600 according to the first exemplary embodiment in a particular configuration of the contact strips of the first contact connection. In the organic light-emitting device 900, the metallic contact layer 110 comprises a triangular structure in an edge region 902. The nearer the metallic contact layer approaches to the recessed region 700, the more said metallic contact layer is recessed from the side surface of the active layer 106. This structure is made particularly clear in FIG. 10. FIG. 10 shows a schematic representation of a vertical section through the organic light-emitting device 900 according to the second exemplary embodiment. It is evident that, in the edge region 902 of the contact strip of the first contact connection, a distance between the side surface 400 and the metallic contact layer 110 increases linearly in the direction toward the recessed region 700. In this way, the charge carrier conductivity of the contact strip decreases in the direction away from the center toward the second corner edge. The injection of charge carriers is reduced accordingly.

Usually, with a linear form, the recessed region 700 extends over approximately 40% of the contact strip. However, this can be selected to be larger or smaller. The form can also be different to have, for example, a parabolic, convex or concave form of one edge of the contact strip, the essential thing being a decrease in the conductivity of the contact strip toward the recessed region 700. Thus, intense field gradients in the active layer 106 at the edge region 902 of the contact strip can be reduced.

Figure 11:
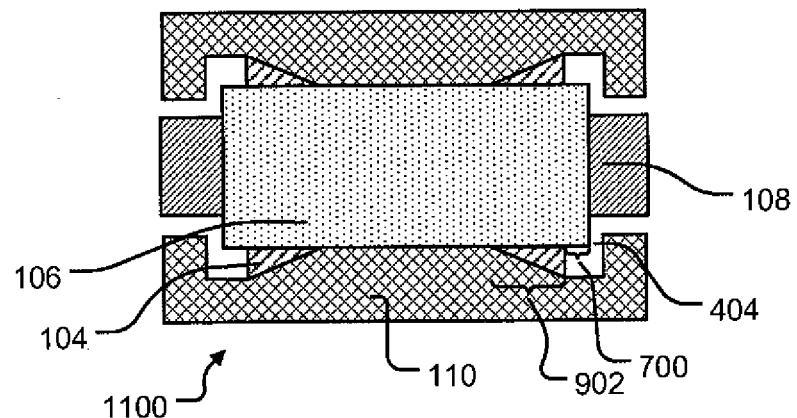
FIG. 11 is a schematic representation of a vertical section through a variant of the organic light-emitting device according to the second exemplary embodiment.
Figure 12:
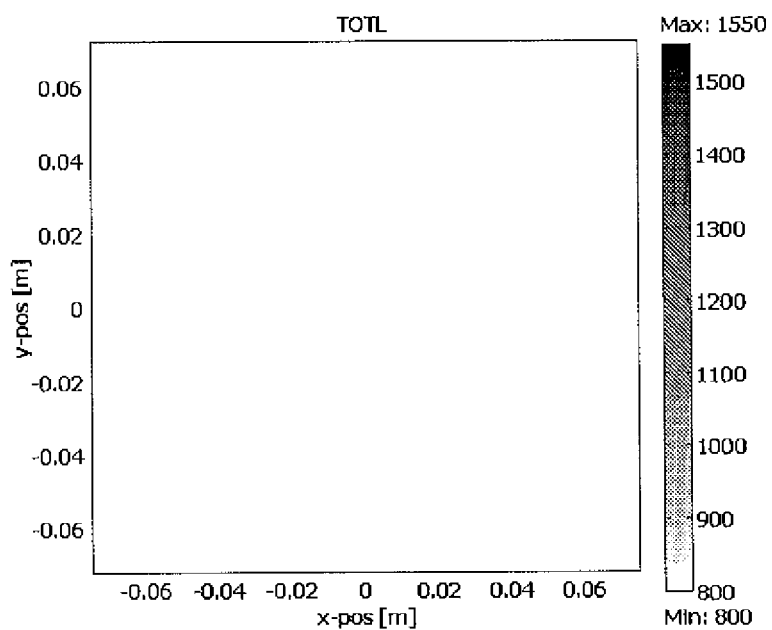
FIG. 12 is a schematic representation of a luminance distribution of the organic light-emitting device according to the second exemplary embodiment.

The remaining geometry of the metallic contact layer 110 is unimportant. In FIG. 11, a variant of the organic light-emitting device according to the second exemplary embodiment is shown. The figure shows a metallic contact layer 110 which extends parallel to the recessed region 700, but does not contact the active layer 106 at the recessed region. Rather, a gap is formed along the recessed region between the contact layer 10 and the active layer 106, so that electrical isolation is obtained. As a result, charge carrier injection via the metallic contact layer 110 in the recessed region is completely suppressed. In order to obtain a homogeneous illumination pattern of the organic light-emitting device, it is important that the conductivity of the contact strip decreases from the center of the lateral extent of the contact strip toward the corner edge 404 and preferably reaches the value zero in a recessed region 700. As a result, a homogeneous illumination pattern is produced by the organic light-emitting device according to the second exemplary embodiment, as shown in FIG. 12. FIG. 12 shows an illumination pattern comparable to that of FIG. 8, wherein only the contact strips are adapted according to the second exemplary embodiment. The luminance in the region of the corner edges is essentially in the order of magnitude of the luminance obtained in large regions of the organic light-emitting device, i.e. in the range of 900 cd/m² to 1000 cd/m². There are also no particularly configured luminance gradients discernible at the contact strips. Overall, a significantly more homogeneous illumination pattern is obtained than in FIG. 5 or FIG. 8.

Figure 13:
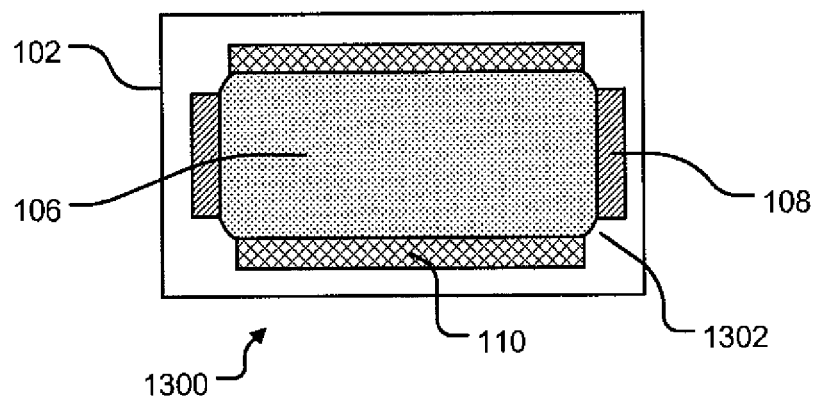
FIG. 13 is a schematic representation of a vertical section through an organic light-emitting device according to a third exemplary embodiment.

FIG. 13 shows a schematic representation of a vertical section through an organic light-emitting device according to a third exemplary embodiment. Based on the third exemplary embodiment of an organic light-emitting device 1300, it is clear that it is also conceivable for the active layer 106 to have a rounded corner edge 1302. It is essential for the technical solution described that, in the region of the corner edges at which two contact strips adjoin one another, a recessed region is provided in which the injection of charge carriers via the contact strips is suppressed as completely as possible.

Figure 14:
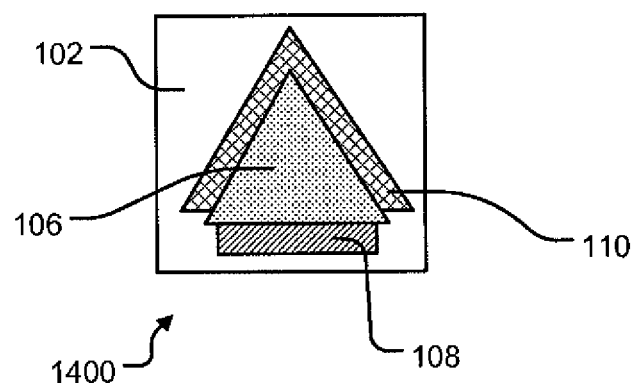
FIG. 14 is a schematic representation of a vertical section through an organic light-emitting device according to a fourth exemplary embodiment.

FIG. 14 shows a schematic representation of a vertical section through an organic light-emitting device according to a fourth exemplary embodiment. With an organic light-emitting device 1400, it is clear that the basic form of the active layer 106 is unimportant to the technical solution as described. Thus, apart from a triangular or rectangular basic form, any other suitable basic form can also be selected.

Figure 15:
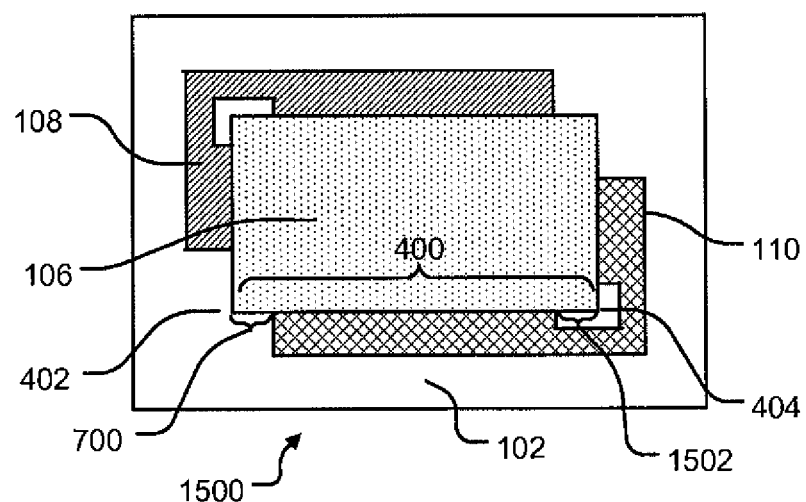
FIG. 15 is a schematic representation of a vertical section through an organic light-emitting device according to a fifth exemplary embodiment.

FIG. 15 shows a schematic representation of a vertical section through an organic light-emitting device according to a fifth exemplary embodiment. An organic light-emitting device 1500 shown differs from the devices in the other exemplary embodiments described in that at least one of the electrodes comprises a contact strip which extends along two adjoining side edges of the active layer 106. The metallic contact layer 110 therefore extends both along the (lower) side surface 400 between the first corner edge 402 and the second corner edge 404. The recessed region 700 is formed adjoining the side surface 400 at the first corner edge 402, the left side surface, along which the second contact connection 108 extends, also adjoining the first corner edge 402. The metallic contact layer 110 also extends along the right-hand side surface. The active layer 106 is thus contacted both at the lower side surface 400 and at the right-hand side surface by the second contact connection via the metallic contact layer 110. In the region of the second corner point 404, a third recessed region 1502 is advantageously provided in order to prevent electrical contact between the metallic contact layer 110 and the active layer 106. By this means, large field gradients are prevented in the region of the second corner edge 404.

CONCLUDING OBSERVATIONS

The organic light-emitting device has been described in order to illustrate the underlying concept using some exemplary embodiments. The exemplary embodiments are not restricted to particular combinations of features. Even if some features and configurations are only described in connection with a particular exemplary embodiment or individual exemplary embodiments, such features and configurations can also be combined with other features from other exemplary embodiments. It is also possible for individual features or particular configurations described to be omitted or added in exemplary embodiments, provided the general technical teaching can still be realized.

The invention claimed is:
1. An organic light-emitting device comprising:
an active layer configured to produce radiation having a first side surface and a second side surface adjoining a corner edge;

a first contact strip extending along the first side surface configured to inject charge carriers of a first type into the active layer; and a second contact strip extending along the second side surface configured to inject charge carriers of a second type into the active layer, wherein:

the first side surface has a recessed region adjoining the corner edge and configured so the injection of charge carriers from the first contact strip is suppressed in the recessed region, the active layer comprises a first main surface and a second main surface, and a first contact connection comprising the first contact strip extends over the first main surface and a second contact connection comprising the second contact strip extends over the second main surface, and the first contact connection has a conductivity profile, the conductivity decreasing from a center of the first side surface toward the recessed region.

2. The organic light-emitting device as claimed in claim 1, the first contact strip being electrically contacted by the first side surface only outside the recessed region.

3. The organic light-emitting device as claimed in claim 1, the injection of charge carriers from the first contact strip being completely suppressed in the recessed region.

4. The organic light-emitting device as claimed in claim 1, a gap being formed along the recessed region between the first contact strip and the active layer.

5. The organic light-emitting device as claimed in claim 1, the second side surface having a second recessed region adjoining the corner edge and the injection of charge carriers from the second contact strip being completely suppressed in the second recessed region.

6. The organic light-emitting device as claimed in claim 1, the first contact connection comprising a conductive oxide.

7. The organic light-emitting device as claimed in claim 1, the first contact connection comprising a metal or a metal alloy.

8. The organic light-emitting device as claimed in claim 1, the first contact connection having a first surface conductivity and the second contact connection having a second surface conductivity and the first surface conductivity and the second surface conductivity differing by not more than a factor of 10.

9. The organic light-emitting device as claimed in claim 1, which is configured as a transparent OLED.

10. The organic light-emitting device as claimed in claim 1, which is configured as a bottom-emitter OLED.

11. The organic light-emitting device as claimed in claim 6, wherein said conductive oxide is tin oxide.

\* \* \* \* \*